(12) United States Patent
Ryu

(10) Patent No.: US 7,812,338 B2
(45) Date of Patent: Oct. 12, 2010

(54) SEMICONDUCTOR LIGHT EMITTING DEVICE

(75) Inventor: Han-youl Ryu, Yongin-si (KR)

(73) Assignee: Samsung Led Co., Ltd., Gyeonggi-do (KR)

( * ) Notice: Subject to any disclaimer, the term of this patent is extended or adjusted under 35 U.S.C. 154(b) by 187 days.

(21) Appl. No.: 11/822,447

(22) Filed: Jul. 6, 2007

(65) Prior Publication Data
US 2008/0093593 A1    Apr. 24, 2008

(30) Foreign Application Priority Data
Oct. 20, 2006    (KR) .................. 10-2006-0102465

(51) Int. Cl.
*H01L 29/06* (2006.01)
(52) U.S. Cl. .................. 257/13; 257/E33.008
(58) Field of Classification Search .................. 257/13, 257/14, 97, E33.008
See application file for complete search history.

(56) References Cited

U.S. PATENT DOCUMENTS

| | | | |
|---|---|---|---|
| 5,684,309 A * | 11/1997 | McIntosh et al. | 257/191 |
| 6,504,171 B1 * | 1/2003 | Grillot et al. | 257/14 |
| 7,279,717 B2 * | 10/2007 | Yamada | 257/97 |

\* cited by examiner

*Primary Examiner*—Mark Prenty
(74) *Attorney, Agent, or Firm*—Harness, Dickey & Pierce, P.L.C.

(57) ABSTRACT

A semiconductor light emitting device may include an n-type contact layer on a substrate. An active layer may be on the n-type contact layer and/or include two or more quantum well layers and two or more barrier layers. A p-type contact layer may be on the active layer. Energy band gaps of the quantum well layers may be larger as the quantum well layers are closer to the n-type contact layer from the p-type contact layer, thicknesses of the quantum well layers may be smaller as the quantum well layers are closer to the n-type contact layer from the p-type contact layer, and/or energy band gaps of the barrier layers may be larger as the barrier layers are closer to the n-type contact layer from the p-type contact layer.

26 Claims, 6 Drawing Sheets

$\lambda_1 > \lambda_2 > \lambda_3$ $Eg1(Q) > Eg2(Q) > Eg3(Q)$

SEMICONDUCTOR LIGHT EMITTING DEVICE

PRIORITY STATEMENT

This application claims the benefit of priority to Korean Patent Application No. 10-2006-0102465, filed on Oct. 20, 2006, in the Korean Intellectual Property Office, the entire contents of which are incorporated herein in their entirety by reference.

BACKGROUND

1. Field

Example embodiments relate to a semiconductor device, and for example, to a semiconductor light emitting device in which the effect of polarization charges may be reduced.

2. Description of Related Art

Colors of light emitted from a light emitting diode (LED) and a laser diode (LD) vary according to a type of semiconductor compound used. A light emitting device in which a nitride-based semiconductor compound is used may emit blue or violet light.

A conventional light emitting device, for example an LED or an LD, includes an active layer for changing current into light. The active layer has a structure in which at least one quantum well layer and at least one barrier layer are stacked, and the quantum well layer has a single quantum well (SQW) structure or a multi-quantum well (MQW) structure. Because a MQW structure more effectively causes emission at a smaller current, the luminous efficiency of a light emitting device having a MQW structure is higher than that of a light emitting device having a SQW structure.

FIG. 1 is an example diagram showing an energy band of an active layer having a MQW structure of a conventional light emitting device. FIG. 1 shows a state where carriers are not injected into the active layer.

Referring to FIG. 1, the energy band of the active layer includes four barrier layer energy bands BE1, BE2, BE3, and BE4 and three quantum well layer energy bands QWE1, QWE2, and QWE3, which are interposed between the barrier layer energy bands BE1, BE2, BE3, and BE4. The quantum well layer energy bands QWE1, QWE2, and QWE3 are separated from one another by the barrier layer energy bands BE1, BE2, BE3, and BE4. Although not shown, the left side of the drawing indicates a direction in which an n-type contact layer exists, and the right side of the drawing indicates a direction in which a p-type contact layer exists. Reference marks Ec and Ev denote the lowest energy level of a conduction band and the highest energy level of a valence band, respectively.

Before voltages are applied to the n-type contact layer and the p-type contact layer, for example, before carriers (e.g., electrons and holes) are injected into the active layer, the quantum well layer energy bands QWE1, QWE2, and QWE3 and the barrier layer energy bands BE1, BE2, BE3, and BE4 are distorted, as illustrated in FIG. 1. The distortion is based on specific characteristics of a nitride-based semiconductor compound and occurs because charges are generated at an interface between a quantum well layer and a barrier layer. A built-in electric field is generated by the interface charges. Due to the built-in electric field, the transition energy of electrons at the quantum well layer is reduced and a light-emitting wavelength is increased.

The energy band distortion phenomenon caused by the interface charges and the transition energy reduction phenomenon may disappear if carriers are sufficiently supplied to the active layer. For example, if voltages are applied to the n-type contact layer and the p-type contact layer and carriers are sufficiently injected into the active layer, interface charges are annihilated by the carriers and the energy band distortion phenomenon and the transition energy reduction phenomenon may disappear.

However, in a conventional nitride-based semiconductor compound, the mobility of holes is smaller, and the amount of holes that reach the quantum well layers that are closer to the n-type contact layer is smaller. Accordingly, even if voltages are applied to the n-type contact layer and the p-type contact layer and carriers are sufficiently injected into the active layer, the energy band distortion phenomenon of the active layer may occur.

FIG. 2 shows the above result where the energy band distortion phenomenon of the active layer occurs. Referring to FIG. 2, even after sufficient carriers are supplied to the active layer having the energy band of FIG. 1, the energy band distortion phenomenon occurs more pronouncedly in the quantum well layers closer to the n-type contact layer. Therefore, the transition energy reduction phenomenon occurs more pronouncedly and a light-emitting wavelength is increased (e.g., $\lambda_1 > \lambda_2 > \lambda_3$) in the quantum well layers closer to the n-type contact layer. The quantum well layers closer to the n-type contact layer may absorb part of the light generated in the quantum well layers closer to the p-type contact layer. Accordingly, the luminous efficiency of the conventional light emitting device including the active layer having the multi-quantum well structure is lowered.

To solve this problem, a method of changing a growth surface of the quantum well layer and a method of doping a material that annihilates interface charges at the interface between the quantum well layer and the barrier layer has been suggested, however, these methods may deteriorate the characteristics of the active layer.

SUMMARY

Example embodiments may provide a semiconductor light emitting device in which lowering of luminous efficiency is minimized by minimizing non-uniformity of a light-emitting wavelength of an active layer having a multi-quantum well (MQW) structure.

According to an example embodiment, a semiconductor light emitting device may include an n-type contact layer on a substrate, an active layer on the n-type contact, and/or a p-type contact layer on the active layer. The active layer may include two or more quantum well layers and two or more barrier layers. At least one of energy band gaps and thicknesses of at least one of the quantum well layers and the barrier layers may change as the at least one of the quantum well layers and the barrier layers are closer to the n-type contact layer from the p-type contact layer.

According to an example embodiment, the energy band gaps of the quantum well layers may be larger as the quantum well layers are closer to the n-type contact layer from the p-type contact layer.

According to an example embodiment, the quantum well layers may be $In_xGa_{1-x}N$ layers, and x may be a number greater than or equal to 0.05 and less than or equal to 0.5.

According to an example embodiment, the amount of indium in the quantum well layers may be smaller as the quantum well layers are closer to the n-type contact layer.

According to an example embodiment, if numbers are allocated from the quantum well layer closest to the n-type contact layer to the quantum well layer closest to the p-type contact layer, an atomic percentage of indium of an Nth quantum well layer may be about 5-20% less than an atomic percentage of indium of an (N+1)th quantum well layer.

According to an example embodiment, thicknesses of the quantum well layers may be smaller as the quantum well layers are closer to the n-type contact layer from the p-type contact layer.

According to an example embodiment, if numbers are allocated from the quantum well layer closest to the n-type contact layer to the quantum well layer closest to the p-type contact layer, a thickness of an Nth quantum well layer may be about 5-20% less than a thickness of an (N+1)th quantum well layer.

According to an example embodiment, energy band gaps of the barrier layers may be larger as the barrier layers are closer to the n-type contact layer from the p-type contact layer.

According to an example embodiment, the barrier layers may be $In_yGa_{1-y}N$ layers, and y may be a number greater than or equal to 0 and less than or equal to 0.1.

According to an example embodiment, the amount of indium in the barrier layers may be smaller as the barrier layers are closer to the n-type contact layer from the p-type contact layer.

According to an example embodiment, if numbers are allocated from the barrier layer closest to the n-type contact layer to the barrier layer closest to the p-type contact layer, an atomic percentage of indium of an Nth barrier layer may be about 5-20% less than an atomic percentage of indium of an (N+1)th barrier layer.

According to an example embodiment, the semiconductor light emitting device may include an electron blocking layer between the active layer and the p-type contact layer.

BRIEF DESCRIPTION OF THE DRAWINGS

The above and/or other aspects and advantages will become more apparent and more readily appreciated from the following detailed description of example embodiments taken in conjunction with the accompanying drawings of which.

DETAILED DESCRIPTION OF EXAMPLE EMBODIMENTS

Figure 1:
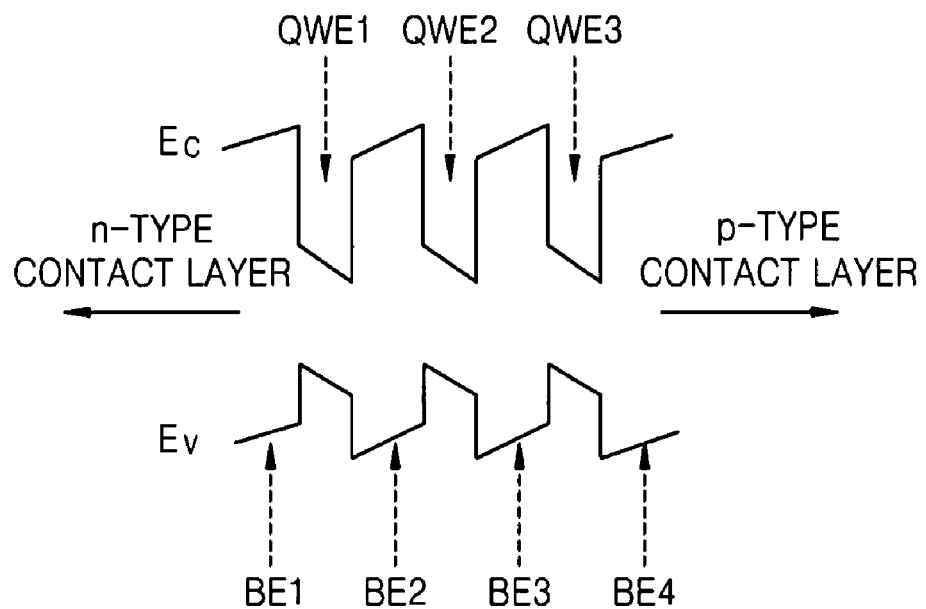
FIG. 1 is an example diagram showing an energy band of an active layer having a multi-quantum well (MQW) structure of a conventional light emitting device in a state where carriers are not injected into the active layer.
Figure 2:
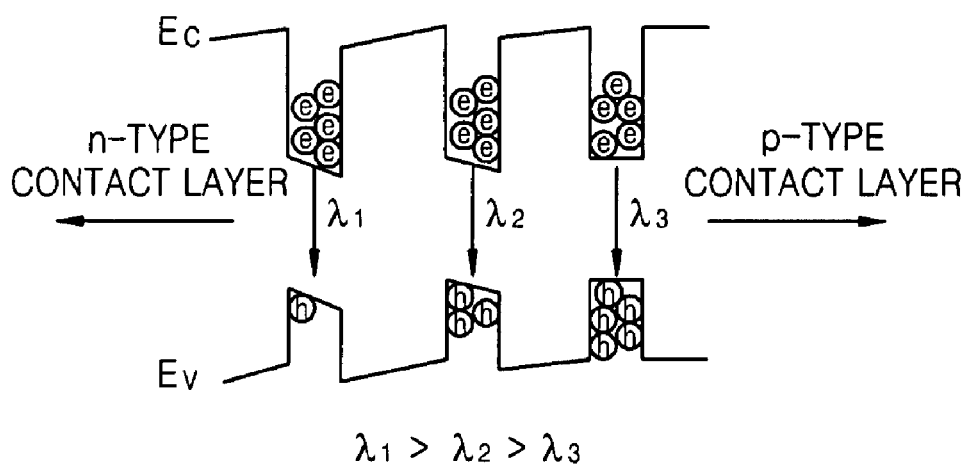
FIG. 2 is an example diagram showing an energy band of the active layer having the multi-quantum well (MQW) structure of a conventional light emitting device in a state where carriers are injected into the active layer of FIG. 1.

Example embodiments will now be described more fully hereinafter with reference to the accompanying drawings. Embodiments may, however, be embodied in many different forms and should not be construed as being limited to the example embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when a component is referred to as being "on," "connected to" or "coupled to" another component, it can be directly on, connected to or coupled to the other component or intervening components may be present. In contrast, when a component is referred to as being "directly on," "directly connected to" or "directly coupled to" another component, there are no intervening components present. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the example embodiments.

Spatially relative terms, such as "beneath," "below," "lower," "above," "upper" and the like, may be used herein for ease of description to describe one component or feature's relationship to another component(s) or feature(s) as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Reference will now be made to example embodiments, which are illustrated in the accompanying drawings, wherein like reference numerals refer to the like components throughout.

Figure 3:
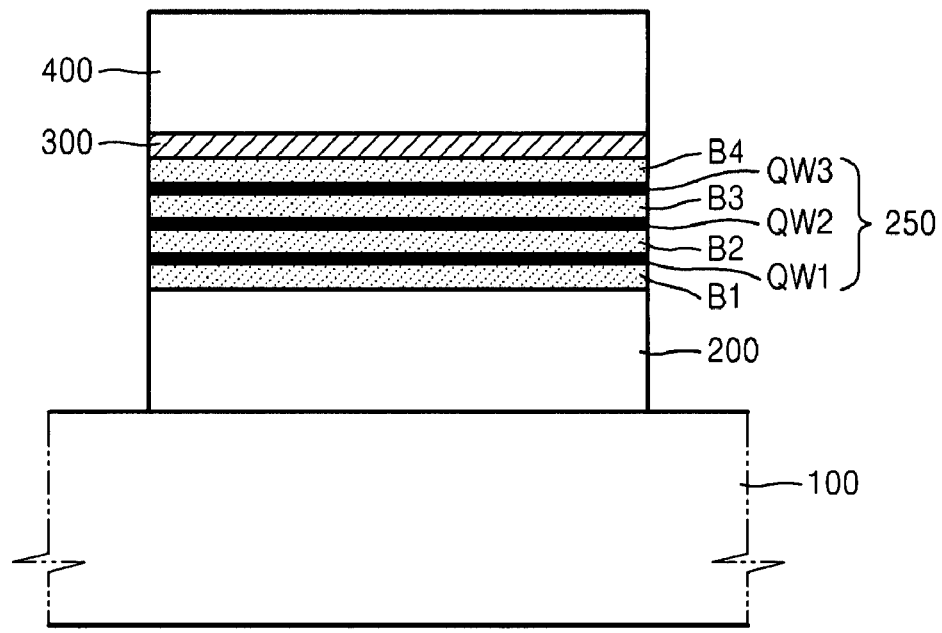
FIG. 3 is a schematic cross-sectional view of a semiconductor light emitting device according to an example embodiment.

FIG. 3 is a schematic view of a semiconductor light emitting device according to an example embodiment.

Referring to FIG. 3, the semiconductor light emitting device may include an n-type contact layer 200 formed on a substrate 100. The substrate 100 may be formed of one material selected from sapphire, SiC, GaN, GaAs, ZnO, and Si. An active layer 250 may be on the n-type contact layer 200. The active layer 250 may include first through third quantum well layers QW1, QW2, and QW3 and first through fourth barrier layers B1, B2, B3, and B4. The first through third quantum well layers QW1, QW2, and QW3 may be interposed between the first through fourth barrier layers B1, B2, B3, and B4, respectively. Thicknesses of the first through third quantum well layers QW1, QW2, and QW3 may be different. An electron blocking layer 300 and/or a p-type contact layer 400 may be sequentially formed on the active layer 250. The number of quantum well layers and the number of barrier layers included in the active layer 250 may be smaller or larger than 3 and 4, respectively. For example, there may be n quantum well layers and n+1 barrier layers included in the active layer 250.

In the active layer 250 according to an example embodiment, the first through third quantum well layers QW1, QW2, and QW3 of the active layer 250 may have larger energy band gaps as the first through third quantum well layers QW1, QW2, and QW3 are closer to the n-type contact layer 200.

In the active layer 250 according to another example embodiment, the first through third quantum well layers QW1, QW2, and QW3 of the active layer 250 may have smaller thicknesses as the first through third quantum well layers QW1, QW2, and QW3 are closer to the n-type contact layer 200.

In the active layer 250 according to still another example embodiment, the first through fourth barrier layers B1, B2, B3, and B4 of the active layer 250 may have larger energy band gaps as the first through fourth barrier layers B1, B2, B3, and B4 are closer to the n-type contact layer 200.

Figure 4:
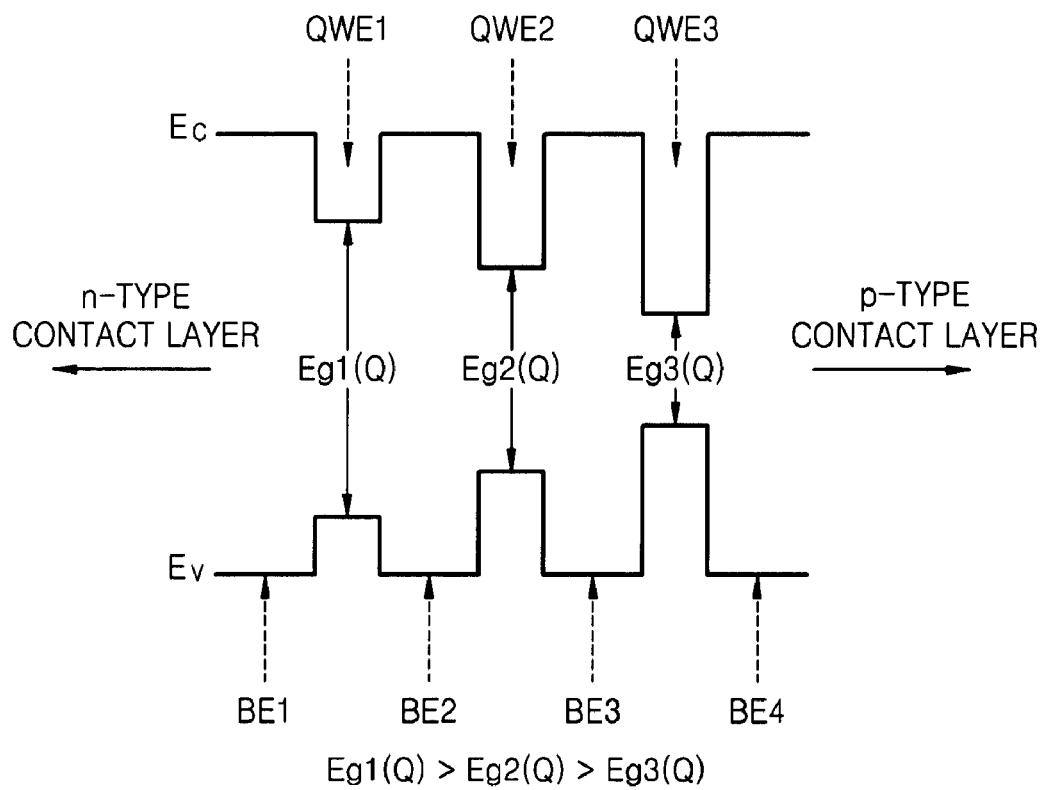
FIGS. 4 through 6 are example diagrams showing an energy band of an active layer of a semiconductor light emitting device according to example embodiments.

FIG. 4 is an example diagram showing an energy band of an active layer 250 (hereinafter, referred to as a first active layer) of a semiconductor light emitting device where the first through third quantum well layers QW1, QW2, and QW3 of the active layer 250 may have larger energy band gaps as the first through third quantum well layers QW1, QW2, and QW3 are closer to the n-type contact layer according to an example embodiment.

Referring to FIG. 4, energy band gaps of first through third quantum well layers QW1, QW2, and QW3 of the first active layer may be larger as the first through third quantum well layers QW1, QW2, and QW3 are closer to an n-type contact layer 200. For example, if the energy band gaps of the first through third quantum well layers QW1, QW2, and QW3 are Eg1(Q), Eg2(Q), and Eg3(Q), respectively, Eg1(Q)>Eg2(Q)>Eg3(Q). Reference numerals BE1 through BE4 may denote energy bands of first through fourth barrier layers B1, B2, B3, and B4, respectively, and reference numerals QWE1 through QWE3 may denote energy bands of the first through third quantum well layers QW1, QW2, and QW3, respectively. Reference marks Ec and Ev may denote the lowest energy level of a conduction band and the highest energy level of a valence band, respectively.

The first through third quantum well layers QW1, QW2, and QW3 may be formed of $In_xGa_{1-x}N$ ($0.05 \leq x \leq 0.5$), and/or energy band gaps thereof may be adjusted according to the amount of indium in the first through third quantum well layers QW1, QW2, and QW3. The amount of indium in the first through third quantum well layers QW1, QW2, and QW3 may be smaller as the first through third quantum well layers QW1, QW2, and QW3 are closer to the n-type contact layer 200. For example, if numbers are allocated from the quantum well layer closest to the n-type contact layer 200 to the quantum well layer closest to the p-type contact layer 400, the amount (e.g., an atomic percentage) of indium of an Nth quantum well layer may be about 5-20% less than the amount (e.g., an atomic percentage) of indium of an (N+1)th quantum well layer.

Accordingly, if the energy band gaps of the first through third quantum well layers QW1, QW2, and QW3 are larger as the first through third quantum layers QW1, QW2, and QW3 are closer to the n-type contact layer 200, the transition energies of the first through third quantum well layers QW1, QW2, and QW3 may be larger as the first through third quantum well layers QW1, QW2, and QW3 are closer to the n-type contact layer 200 if a current is not applied between the n-type contact layer 200 and the p-type contact layer 400. However, the degree of reduction in transition energies of the first through third quantum well layers QW1, QW2, and QW3 may be larger as the first through third quantum well layers QW1, QW2, and QW3 are closer to the n-type contact layer 200 if a current of about 10 mA to about 10 A is applied between the n-type contact layer 200 and the p-type contact layer 400. Accordingly, the wavelengths of light emitted from the first through third quantum well layers QW1, QW2, and QW3 of the first active layer may be substantially the same. Therefore, the amount of absorption between the first through third quantum well layers QW1, QW2, and QW3 may be reduced and/or luminous efficiency may be improved.

FIG. 4 illustrates an example embodiment where the thicknesses of the first through third quantum well layers QW1, QW2, and QW3 are the same and the energy band gaps of the first through fourth barrier layers B1, B2, B3, and B4 are the same. However, in example embodiments the thicknesses of the first through third quantum well layers QW1, QW2, and QW3 may be different and/or the energy band gaps of the first through fourth barrier layers B1, B2, B3, and B4 may be different.

Figure 5:
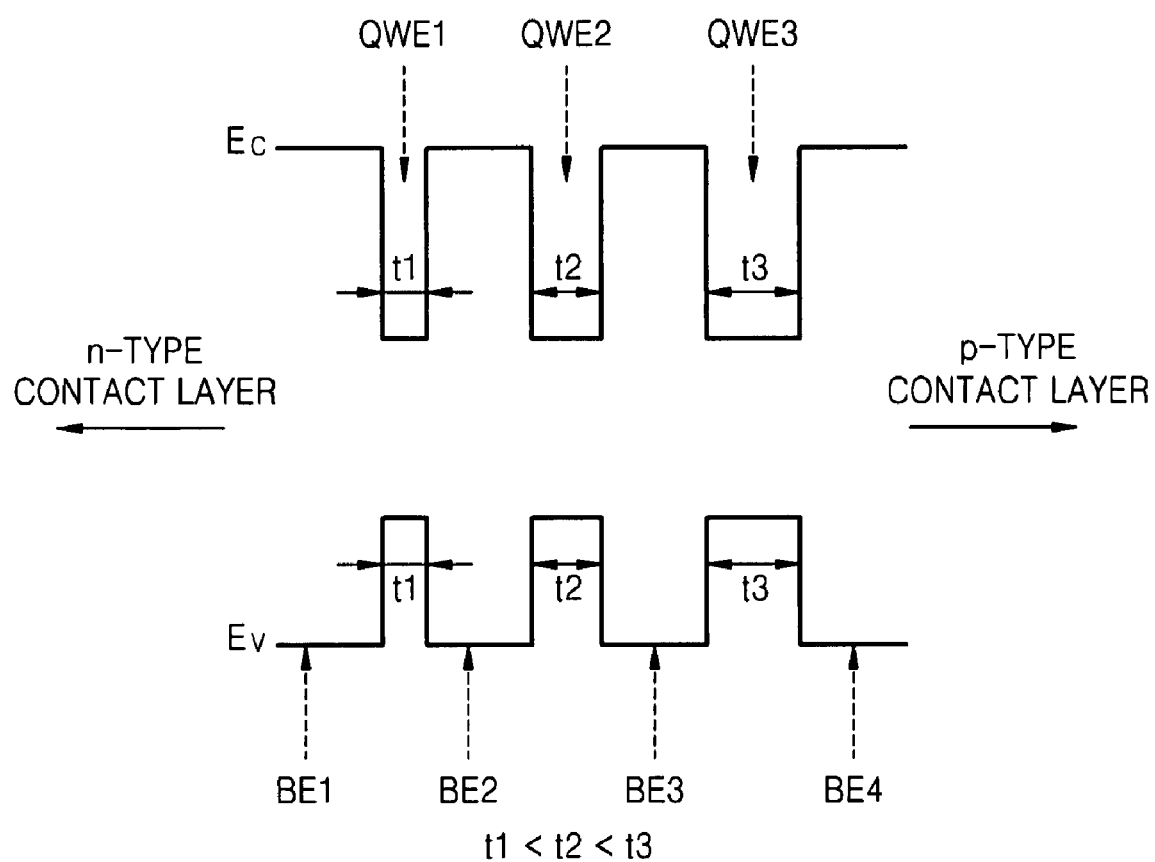

FIG. 5 is an example diagram showing an energy band of an active layer 250 (hereinafter, referred to as a second active layer) of a semiconductor light emitting device where the first through third quantum well layers QW1, QW2, and QW3 of the active layer 250 may have smaller thicknesses as the first through third quantum well layers QW1, QW2, and QW3 are closer to the n-type contact layer 200 according to another example embodiment.

Referring to FIG. 5, the thicknesses of first through third quantum well layers QW1, QW2, and QW3 of the second active layer may be smaller as the first through third quantum well layers QW1, QW2, and QW3 are closer to an n-type contact layer 200. For example, if the thicknesses of the first through third quantum well layers QW1, QW2, and QW3 are t1, t2, and t3, respectively, t1<t2<t3. Reference numerals BE1 through BE4 may denote energy bands of first through fourth barrier layers B1, B2, B3, and B4, respectively, and reference numerals QWE1 through QWE3 may denote energy bands of the first through third quantum well layers QW1, QW2, and QW3, respectively. Reference marks Ec and Ev may denote the lowest energy level of a conduction band and the highest energy level of a valence band, respectively.

For example, if numbers are allocated from the quantum well layer closest to the n-type contact layer 200 to the quantum well layer closest to the p-type contact layer 400, the thickness of an Nth quantum well layer may be 5-20% less than the thickness of an (N+1)th quantum well layer.

Accordingly, an effect from another example embodiment where the thicknesses of first through third quantum well layers QW1, QW2, and QW3 of the second active layer are smaller as the first through third quantum well layers QW1, QW2, and QW3 are closer to an n-type contact layer 200 may be similar to the effect from an example embodiment where the energy band gaps of the first through third quantum well layers QW1, QW2, and QW3 are larger as the first through third quantum well layers QW1, QW2, and QW3 are closer to the n-type contact layer 200.

FIG. 5 illustrates another example embodiment where the energy band gaps of the first through third quantum well layers QW1, QW2, and QW3 are the same and the energy band gaps of the first through fourth barrier layers B1, B2, B3, and B4 are the same. However, in example embodiments the first through third quantum well layers QW1, QW2, and QW3 may have different energy band gaps and/or the first through fourth barrier layers B1, B2, B3, and B4 may have different energy band gaps.

Figure 6:
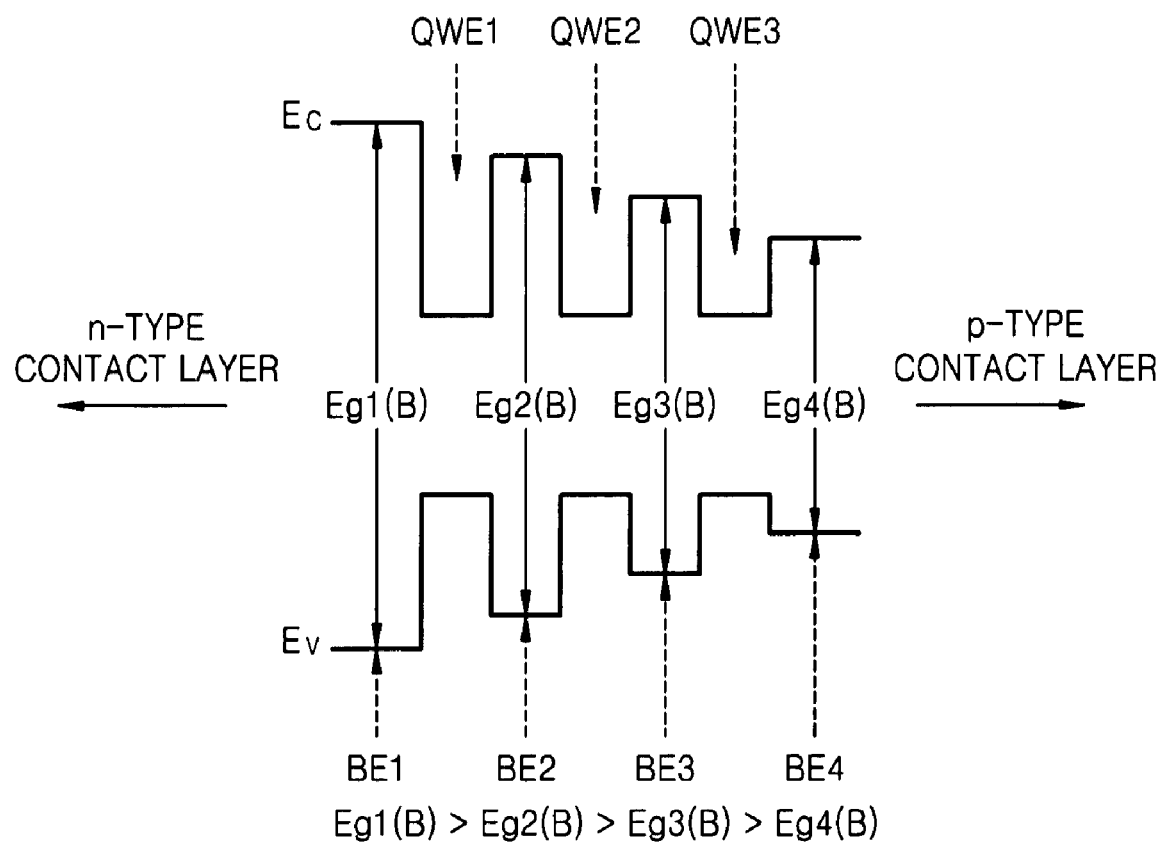

FIG. 6 is an example diagram showing an energy band of an active layer 250 (hereinafter, referred to as a third active layer) of a semiconductor light emitting device where the first through fourth barrier layers B1, B2, B3, and B4 of the active layer 250 may have larger energy band gaps as the first through fourth barrier layers B1, B2, B3, and B4 are closer to the n-type contact layer 200 according to still another example embodiment.

Referring to FIG. 6, first through fourth barrier layers B1, B2, B3, and B4 of the third active layer may have higher energy band gaps as the first through fourth barrier layers B1, B2, B3, and B4 are closer to the n-type contact layer 200. For example, if the energy band gaps of the first through fourth barrier layers B1, B2, B3, and B4 are Eg1(B), Eg2(B), Eg3(B), and Eg4(B), respectively, Eg1(B)>Eg2(B)>Eg3(B)>Eg4(B). Reference numerals BE1 through BE4 may denote energy bands of first through fourth barrier layers B1, B2, B3, and B4, respectively, and reference numerals QWE1 through QWE3 may denote energy bands of the first through third quantum well layers QW1, QW2, and QW3, respectively. Reference marks Ec and Ev may denote the lowest energy level of a conduction band and the highest energy level of a valence band, respectively.

The first through fourth barrier layers B1, B2, B3, and B4 may be formed of $In_yGa_{1-y}N$ ($0 \leq y \leq 0.1$), and energy band gaps of the first through fourth barrier layers B1, B2, B3, and B4 may be adjusted according to the amount of indium in the first through fourth barrier layers B1, B2, B3, and B4. The amount of indium in the first through fourth barrier layers B1, B2, B3, and B4 may be smaller as the first through fourth barrier layers B1, B2, B3, and B4 are closer to the n-type contact layer 200. For example, if numbers are allocated from the barrier layer closest to the n-type contact layer 200 to the barrier layer closest to the p-type contact layer 400, the amount (e.g., an atomic percentage) of indium of an Nth barrier layer may be about 5-20% less than the amount (e.g., an atomic percentage) of indium of an (N+1)th barrier layer.

Accordingly, if the energy band gaps of the first through fourth barrier layers B1, B2, B3, and B4 are larger as the first through fourth barrier layers B1, B2, B3, and B4 are closer to the n-type contact layer 200, due to a difference in energy band gaps of the first through fourth barrier layers B1, B2, B3, and B4, carriers may more easily move to the quantum well layer as the first through fourth barrier layers B1, B2, B3, and B4 are closer to the n-type contact layer 200. Therefore, if the semiconductor light emitting device operates, as the first through fourth barrier layers B1, B2, B3, and B4 are closer to the n-type contact layer 200, the larger amount of a transition energy may be reduced, and/or may be compensated for. Accordingly, non-uniformity of light-emitting wavelengths caused by a difference in transition energy may be minimized so that absorption between the first through third quantum well layers QW1, QW2, and QW3 may be reduced and/or luminous efficiency may be improved.

FIG. 6 illustrates still another example embodiment where the energy band gaps and the thicknesses of the first through third quantum well layers QW1, QW2, and QW3 are the same. However, in example embodiments the first through third quantum well layers QW1, QW2, and QW3 may have different energy band gaps and/or different thicknesses.

FIGS. 7 through 10 show example simulation results of the semiconductor light emitting device according to example embodiments in which an active layer 250 may include first and second quantum well layers QW1 and QW2 and first through third barrier layers B1, B2, and B3. A change in peak wavelength with respect to electron density in a quantum well layer is shown in FIGS. 7 through 10.

The first quantum well layer QW1 may be closer to an n-type contact layer, and the second quantum well layer QW2 may be closer to a p-type contact layer. Constructions of the first and second quantum well layers QW1 and QW2 and the first through third barrier layers B1, B2, and B3 may be as illustrated in FIG. 3. The first and second quantum well layers QW1 and QW2 may be formed of $In_xGa_{1-x}N$ ($0.05 \leq x \leq 0.5$), and/or the first through third barrier layers B1, B2, and B3 may be formed of $In_yGa_{1-y}N$ ($0 \leq y \leq 0.1$).

Figure 7:
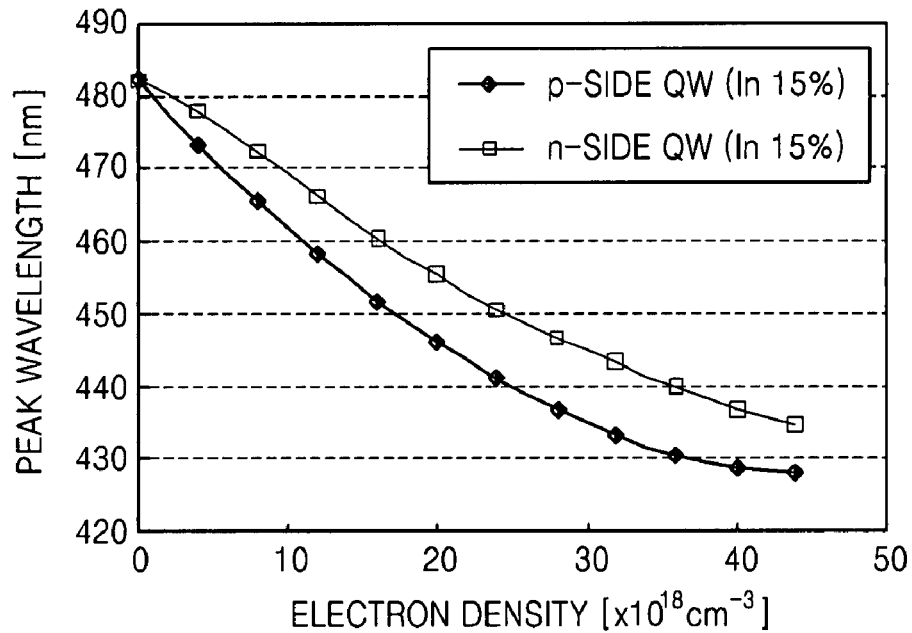
FIGS. 7 through 10 show example simulation results of the semiconductor light emitting device of example embodiments according to a change in peak wavelength with respect to electron density in a quantum well layer.

FIG. 7 shows an example simulation result if the first and second quantum well layers QW1 and QW2 have the same amount, for example 15%, of indium. On the other hand, FIG. 8 shows an example simulation result if the first and second quantum well layers QW1 and QW2 of the active layer 250 have larger energy band gaps as the first and second quantum well layers QW1 and QW2 are closer to the n-type contact layer 200, and in FIG. 8, the amount of indium of the first quantum well layer QW1 may be about 13.5% and the amount of indium of the second quantum well layer QW2 may be about 15%.

Figure 8:
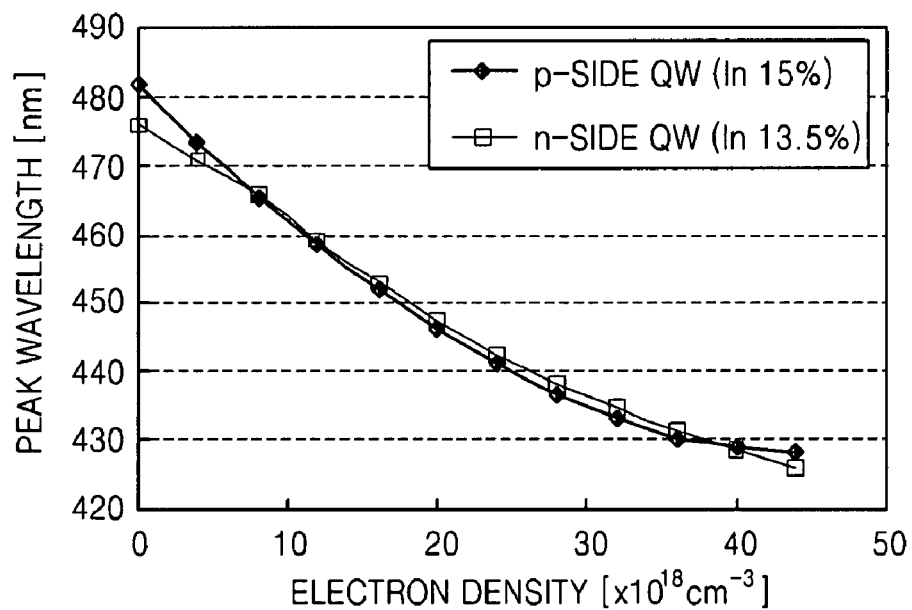

In the simulation for obtaining the example simulation results of FIGS. 7 and 8, the first and second quantum well layers QW1 and QW2 may have the same thicknesses of 25 Å, and/or the first through third barrier layers B1, B2, and B3 may have the same amount, for example 2%, of indium. A built-in electric field may be 1 MV/cm.

Referring to FIG. 7, if the first and second quantum well layers QW1 and QW2 have the same amount, for example 15%, of indium, a difference in peak wavelengths between the first and second quantum well layers QW1 and QW2 may be about 10 nm.

Referring to FIG. 8, if the amount of indium of the first quantum well layer QW1 is about 13.5% and the amount of indium of the second quantum well layer QW2 is about 15%, a difference in peak wavelengths between the first and second quantum well layers QW1 and QW2 in most operating regions may be less than 2 nm and/or may be negligible.

It is noted from the example simulation results of FIGS. 7 and 8 that, if the amount of indium of the first quantum well layer QW1 that is closer to the n-type contact layer is lower than the amount of indium of the second quantum well layer QW2 that is closer to the p-type contact layer, luminous efficiency may be improved.

Figure 9:
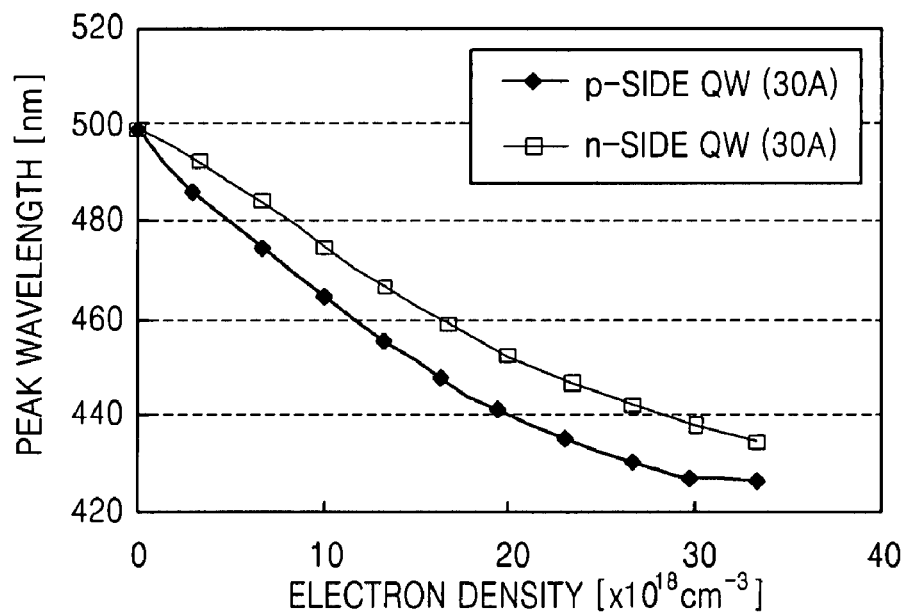

FIG. 9 shows an example simulation result if the first and second quantum well layers QW1 and QW2 have the same thicknesses of about 30 Å. On the other hand, FIG. 10 shows an example simulation result if the first and second quantum well layers QW1 and QW2 of the active layer 250 have smaller thicknesses as the first and second quantum well layers QW1 and QW2 are closer to the n-type contact layer 200, and in FIG. 10, the thickness of the first quantum well layer QW1 may be about 27 Å and/or the thickness of the second quantum well layer QW2 may be about 30 Å.

Figure 10:
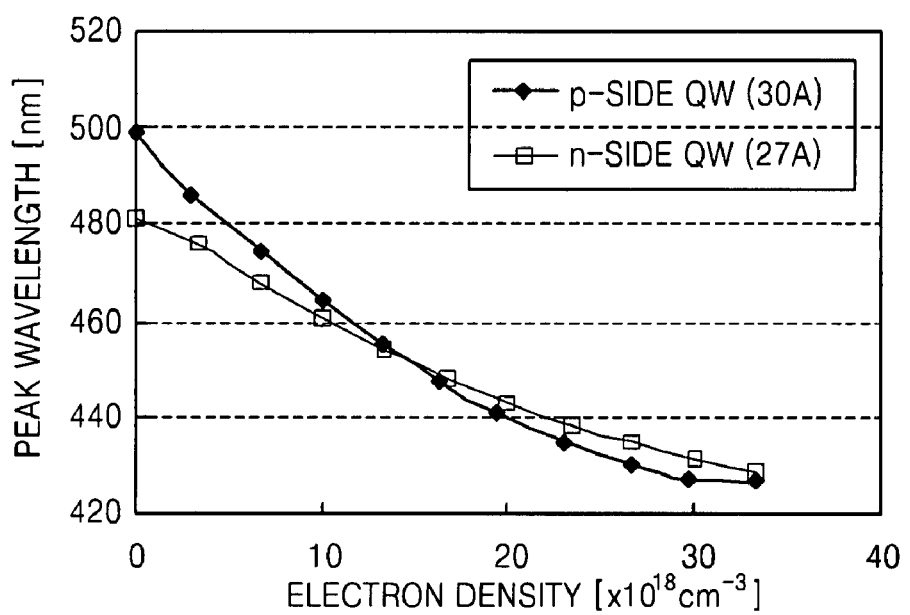

In FIGS. 9 and 10, the first and second quantum well layers QW1 and QW2 may have the same amount of indium, for example 13%, and the first through third barrier layers B1, B2, and B3 may have the same amount of indium, for example 2%. A built-in electric field may be 1 MV/cm.

Referring to FIG. 9, if the first and second quantum well layers QW1 and QW2 have the same thicknesses of about 30

Å, a difference in peak wavelengths between the first and second quantum well layers QW1 and QW2 may be about 10 nm.

Referring to FIG. 10, if the thickness of the first quantum well layer QW1 is about 27 Å and the thickness of the second quantum well layer QW2 is about 30 Å, a difference in peak wavelengths between the first and second quantum well layers QW1 and QW2 may be smaller than 10 nm.

It may be noted from the example simulation results of FIGS. 9 and 10 that, if the thickness of the first quantum well layer QW1 that is closer to the n-type contact layer is smaller than the thickness of the second quantum well layer QW2 that is closer to the p-type contact layer, luminous efficiency may be improved.

As described above, the energy band gaps and/or thicknesses of the quantum well layers (or the barrier layers) in the semiconductor light emitting device according to example embodiments may be larger or smaller as the quantum well layers (or the barrier layers) are closer to the n-type contact layer. Accordingly, if the semiconductor light emitting device is operated non-uniformity of light-emitting wavelengths within the active layer may be minimized. Therefore, light absorption between the quantum well layers may be reduced and/or luminous efficiency may be improved. For example, such an effect may occur more pronouncedly in a blue or green light emitting device that includes a larger amount of indium in the active layer. The larger the amount of indium included in the active layer, the larger the amount of transition energy that may be reduced, and if the active layer structure of the blue or green light emitting device is made the same as the active layer structure of example embodiments, a transition energy reduction phenomenon of the blue or green light emitting device may be reduced.

In the semiconductor light emitting device according to example embodiments, the composition and/or thickness of the active layer may be changed such that deterioration of the characteristics of the active layer is reduced.

Although example embodiments have been shown and described in this specification and figures, it would be appreciated by those skilled in the art that changes may be made to the illustrated and/or described example embodiments without departing from their principles and spirit.

What is claimed is:

1. A semiconductor light emitting device, the device comprising:
an n-type contact layer on a substrate;
an active layer on the n-type contact layer and including two or more quantum well layers and two or more barrier layers; and
a p-type contact layer on the active layer,
wherein the energy band gaps of the quantum well layers are larger as the quantum well layers are closer to the n-type contact layer from the p-type contact layer, and
if numbers are allocated from the quantum well layer closest to the n-type contact layer to the quantum well layer closest to the p-type contact layer, an atomic percentage of indium of an Nth quantum well layer is about 5-20% less than an atomic percentage of indium of an (N+1)th quantum well layer.

2. A semiconductor light emitting device, the device comprising:
an n-type contact layer on a substrate;
an active layer on the n-type contact layer and including two or more quantum well layers and two or more barrier layers; and
a p-type contact layer on the active layer,
wherein thicknesses of the quantum well layers change as the quantum well layers are closer to the n-type contact layer from the p-type contact layer, and
if numbers are allocated from the quantum well layer closest to the n-type contact layer to the quantum well layer closest to the p-type contact layer, a thickness of an Nth quantum well layer is about 5-20% less than a thickness of an (N+1)th quantum well layer.

3. A semiconductor light emitting device, the device comprising:
an n-type contact layer on a substrate;
an active layer on the n-type contact layer and including two or more quantum well layers and two or more barrier layers; and
a p-type contact layer on the active layer,
wherein energy band gaps of the barrier layers change as the barrier layers are closer to the n-type contact layer from the p-type contact layer, and
if numbers are allocated from the barrier layer closest to the n-type contact layer to the barrier layer closest to the p-type contact layer, an atomic percentage of indium of an Nth barrier layer is about 5-20% less than an atomic percentage of indium of an (N+1)th barrier layer.

4. The device of claim 1, wherein
the quantum well layers are $In_xGa_{1-x}N$ layers, and
x is a number greater than or equal to 0.05 and less than or equal to 0.5.

5. The device of claim 1, wherein thicknesses of the quantum well layers are smaller as the quantum well layers are closer to the n-type contact layer from the p-type contact layer.

6. The device of claim 5, wherein if numbers are allocated from the quantum well layer closest to the n-type contact layer to the quantum well layer closest to the p-type contact layer, a thickness of an Nth quantum well layer is about 5-20% less than a thickness of an (N+1)th quantum well layer.

7. The device of claim 1, wherein energy band gaps of the barrier layers are larger as the barrier layers are closer to the n-type contact layer from the p-type contact layer.

8. The device of claim 1, wherein
the barrier layers are $In_yGa_{1-y}N$ layers, and
y is a number greater than or equal to 0 and less than or equal to 0.1.

9. The device of claim 8, wherein the amount of indium in the barrier layers is smaller as the barrier layers are closer to the n-type contact layer from the p-type contact layer.

10. The device of claim 9, wherein if numbers are allocated from the barrier layer closest to the n-type contact layer to the barrier layer closest to the p-type contact layer, an atomic percentage of indium of an Nth barrier layer is about 5-20% less than an atomic percentage of indium of an (N+1)th barrier layer.

11. The device of claim 1, further comprising:
an electron blocking layer between the active layer and the p-type contact layer.

12. The device of claim 2, wherein
the quantum well layers are $In_xGa_{1-x}N$ layers, and
x is a number greater than or equal to 0.05 and less than or equal to 0.5.

13. The device of claim 12, wherein an amount of indium in the quantum well layers is smaller as the quantum well layers are closer to the n-type contact layer from the p-type contact layer.

14. The device of claim 13, wherein if numbers are allocated from the quantum well layer closest to the n-type contact layer to the quantum well layer closest to the p-type contact layer, an atomic percentage of indium of an Nth quantum well layer is about 5-20% less than an atomic percentage of indium of an (N+1)th quantum well layer.

15. The device of claim 2, wherein energy band gaps of the barrier layers are larger as the barrier layers are closer to the n-type contact layer from the p-type contact layer.

16. The device of claim 2, wherein
the barrier layers are $In_yGa_{1-y}N$ layers, and
y is a number greater than or equal to 0 and less than or equal to 0.1.

17. The device of claim 16, wherein an amount of indium in the barrier layers is smaller as the barrier layers are closer to the n-type contact layer from the p-type contact layer.

18. The semiconductor light emitting device of claim 17, wherein if numbers are allocated from the barrier layer closest to the n-type contact layer to the barrier layer closest to the p-type contact layer, an atomic percentage of indium of an Nth barrier layer is about 5-20% less than an atomic percentage of indium of an (N+1)th barrier layer.

19. The semiconductor light emitting device of claim 2, further comprising:
an electron blocking layer between the active layer and the p-type contact layer.

20. The device of claim 3, wherein energy band gaps of the barrier layers are larger as the barrier layers are closer to the n-type contact layer from the p-type contact layer.

21. The device of claim 20, wherein
the barrier layers are $In_yGa_{1-y}N$ layers,
and y is greater than or equal to 0 and less than or equal to 0.1.

22. The device of claim 20, wherein if numbers are allocated from the quantum well layer closest to the n-type contact layer to the quantum well layer closest to the p-type contact layer, a thickness of an Nth quantum well layer is about 5-20% less than a thickness of an (N+1)th quantum well layer.

23. The device of claim 20, wherein
the quantum well layers are $In_xGa_{1-x}N$ layers, and
x is a number greater than or equal to 0.05 and less than or equal to 0.5.

24. The device of claim 23, wherein the amount of indium in the quantum well layers is smaller as the quantum well layers are closer to the n-type contact layer from the p-type contact layer.

25. The device of claim 24, wherein if numbers are allocated from the quantum well layer closest to the n-type contact layer to the quantum well layer closest to the p-type contact layer, an atomic percentage of indium of an Nth quantum well layer is about 5-20% less than an atomic percentage of indium of an (N+1)th quantum well layer.

26. The device of claim 20, further comprising:
an electron blocking layer between the active layer and the p-type contact layer.

* * * * *